(12) United States Patent
Zakel et al.

(10) Patent No.: US 8,497,578 B2
(45) Date of Patent: Jul. 30, 2013

(54) TERMINAL FACE CONTACT STRUCTURE AND METHOD OF MAKING SAME

(75) Inventors: Elke Zakel, Nauen (DE); Thorsten Teutsch, Santa Cruz, CA (US)

(73) Assignee: Pac Tech—Packaging Technologies GmbH, Nauen (DE)

( * ) Notice: Subject to any disclaimer, the term of this patent is extended or adjusted under 35 U.S.C. 154(b) by 53 days.

(21) Appl. No.: 12/991,581

(22) PCT Filed: Mar. 10, 2009

(86) PCT No.: PCT/DE2009/000311
§ 371 (c)(1),
(2), (4) Date: Nov. 8, 2010

(87) PCT Pub. No.: WO2009/138048
PCT Pub. Date: Nov. 19, 2009

(65) Prior Publication Data
US 2011/0057312 A1    Mar. 10, 2011

(30) Foreign Application Priority Data
May 14, 2008    (DE) .......................... 10 2008 023 422

(51) Int. Cl.
*H01L 23/48*    (2006.01)
(52) U.S. Cl.
USPC .................... 257/737; 257/741; 257/E23.023
(58) Field of Classification Search
USPC ................................................ 257/737, 741
IPC ............................................ H01L 24/10,24/01
See application file for complete search history.

(56) References Cited

U.S. PATENT DOCUMENTS

| 6,388,322 | B1 | 5/2002 | Goossen et al. |
| 6,960,828 | B2 * | 11/2005 | Nair et al. ..................... 257/734 |
| 7,005,752 | B2 * | 2/2006 | Bojkov et al. ................. 257/786 |
| 2003/0151140 | A1 * | 8/2003 | Nishiyama et al. ........... 257/737 |
| 2005/0263907 | A1 | 12/2005 | Yamano |
| 2006/0091541 | A1 * | 5/2006 | Bojkov et al. ................. 257/737 |
| 2008/0088013 | A1 | 4/2008 | Chew |

FOREIGN PATENT DOCUMENTS

| JP | 2002 207298 A | 7/2002 |
| WO | 2008 032944 A | 3/2008 |

OTHER PUBLICATIONS

PCT International Preliminary Report on Patentability, Application No. PCT/DE2009/000311, Dec. 16, 2010.
International Search Report under date of Aug. 21, 2009 in connection with PCT/DE2009/000311.

* cited by examiner

*Primary Examiner* — Eva Yan Montalvo
(74) *Attorney, Agent, or Firm* — Quarles & Brady LLP

(57) ABSTRACT

The invention relates to a contact structure (24) and to a method for producing a contact structure for semiconductor substrates (21) or the like, in particular for terminal faces of semiconductor substrates, comprising a base contact part (22) arranged on a terminal face (20) of the semiconductor substrate and at least one connecting contact part (23) arranged on the base contact part, wherein the connecting contact part is formed from a connecting contact material (34) which has a lower melting point than a base contact material of the base contact part.

17 Claims, 2 Drawing Sheets

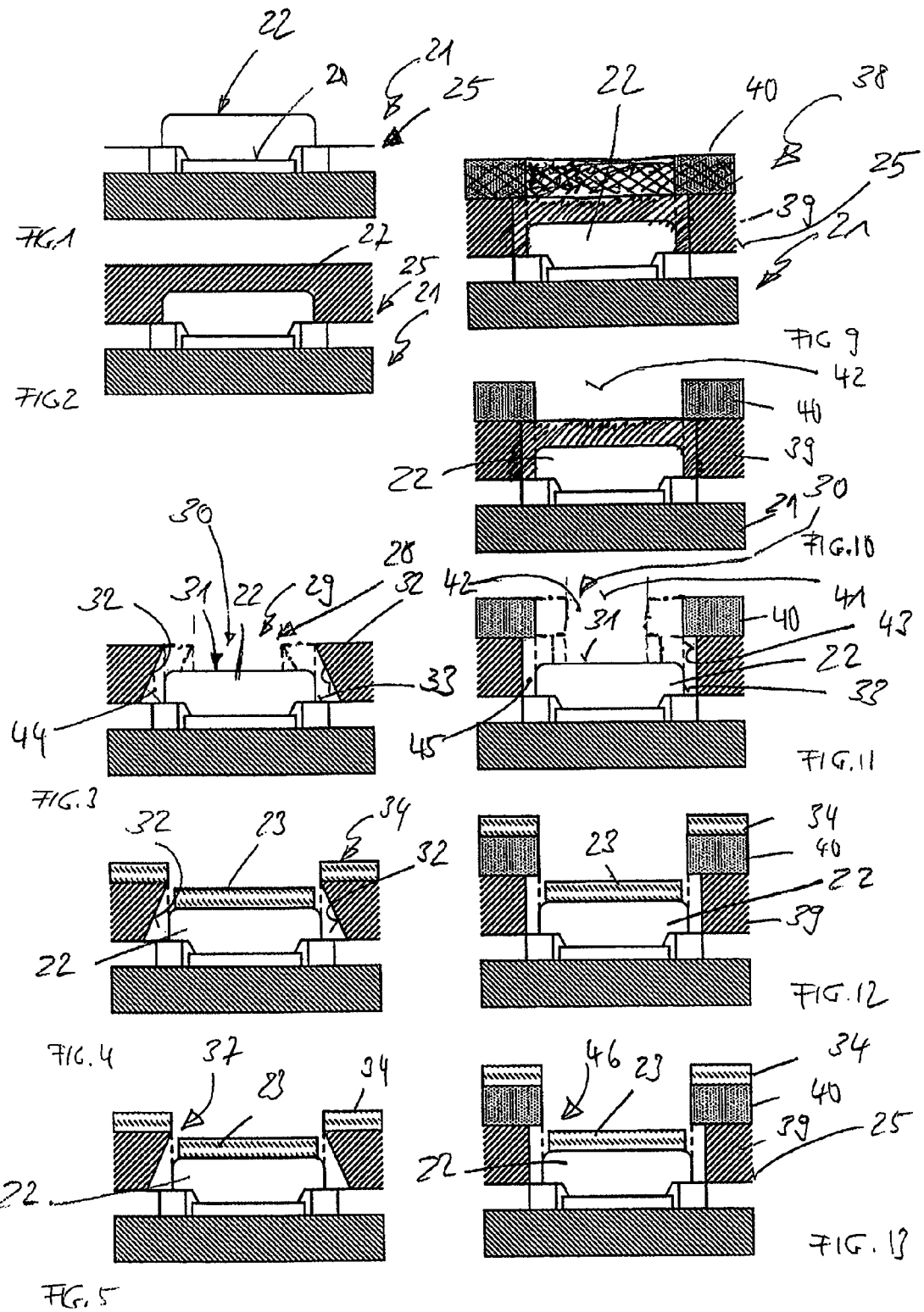

TERMINAL FACE CONTACT STRUCTURE AND METHOD OF MAKING SAME

CROSS-REFERENCE TO RELATED APPLICATIONS

Figure 6:
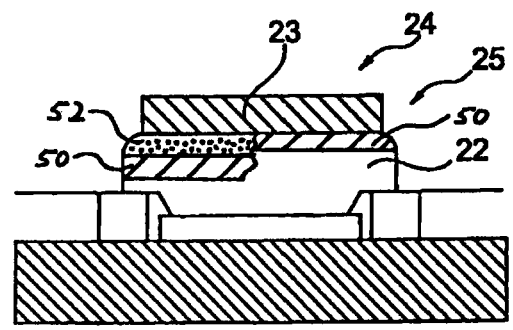

This application claims priority to PCT International Application No. PCT/DE2009/000311 filed on Mar. 10, 2009, which claims priority to German Patent Application No. 10 2008 023 422.2 filed Mar. 14, 2008, both of which are incorporated herein by reference.

The present invention relates to a contact structure and to a method for producing a contact structure for semiconductor substrates, in particular for terminal faces of semiconductor substrates, comprising a base contact part arranged on a terminal face of the semiconductor substrate and at least one connecting contact part arranged on the base contact part, wherein the connecting contact part is formed from a connecting contact material which has a lower melting point than a base contact material of the base contact part.

Contact structures for semiconductor substrates are frequently also referred to as "bumps", which are essentially composed of a metallization which is applied to a terminal face of a semiconductor substrate and which forms a raised contact with respect to the circumjacent surface of the semiconductor substrate. These raised contacts, which for instance are also formed on terminal faces of printed circuit boards (PCB), essentially fulfill the function of establishing an electrically conductive and mechanically firm connection between the semiconductor substrate and the contact substrate subsequent to the formation of a contact with the terminal face of a substrate to be contacted by at least partially melting the metallization. Moreover, due to the raised contacts formed by the bumps, a gap is formed between the semiconductor substrate and the contact substrate and can be filled with an electrically insulating filler material in order to mechanically stabilize the substrate arrangements formed by the contacting between the semiconductor substrate and the contact substrate and to realize a sealing covering of the contact points.

In particular in the case of relatively large substrates to be connected, in practice it has frequently proven laborious to realize a contacting of the substrates in all opposing contact points while simultaneously realizing a plane-parallel arrangement of the substrates. The capillary forces generated in a reflow process for melting the contact metallizations frequently give rise to warpage of the substrates with the consequence that the gap between the substrates is not formed uniformly.

Thus, it is an object of the invention to suggest a contact structure that enables the formation of a largely uniform gap between the substrates when two substrates are contacted to produce a substrate arrangement.

To attain this object, the inventive contact structure has the features of claim 1.

The inventive contact structure for semiconductor substrates or the like comprises a base contact part arranged on a terminal face of the semiconductor substrate and at least one connecting contact part arranged on the base contact part, wherein the connecting contact part is formed from a connecting contact material which has a lower melting point than a base contact material of the base contact part.

Due to the differentiation in terms of the base contact material, respectively the connecting contact material used for the base contact part and the connecting contact part, the inventive contact structure enables a functional differentiation between the parts of the contact structure in such a manner that the base contact material, which compared with the connecting contact material has a relatively high melting point, enables the setting of a defined contact height, which can be retained also subsequent to the melting of the connecting contact part to produce the mechanical, electrically conductive joined connection with a terminal face of the contact substrate.

Preferably, the base contact part is formed from the base contact material applied to the terminal face in an electroless deposition process. In this process, the generally known good controllability of the electroless deposition process is advantageously used by setting the suitable process parameters, in order to subsequently arrange the metallization to be melted, which is essential for the actual connecting process and which is formed by the connecting contact part, at a precisely defined height, respectively distance above the surface of the substrate. In particular, the electroless deposition process makes it possible for a plurality of terminal faces arranged in a terminal face arrangement on the surface of the semiconductor substrate to carry out a selective formation of arbitrary individual base contact parts or else groups of base contact parts, for instance by temporary covering a part of the terminal faces, in order to form base contact parts only on the freely accessible terminal faces of the semiconductor substrate. In this manner, base contact parts as a matter of fact can also be formed at various heights on a terminal face arrangement of a semiconductor substrate.

It is also particularly advantageous if the connecting contact part is formed by the connecting contact material which is applied to the base contact part by means of a sputtering process or else by means of a vapor-phase deposition process. Connecting contact parts formed using such methods can be produced with a particularly small layer thickness, so that connecting contact parts can be realized which, due to their low mass, are only relatively slightly modified also in their height in a melting process. As a result, by means of this measure, contact structures can be realized which have a height that is substantially fixedly determined by the height of the base contact parts and which, due to the low mass of the connecting contact parts, are likewise only slightly modified in their height in a melting process. Consequently, the gap width between two substrates of a substrate arrangement is essentially defined from the outset by the height of the contact structures.

In particular for enhancing the adhesive force between the base contact part and the connecting contact part, the base contact part may have a layer structure which comprises a base layer and at least one built-up layer in the transition zone towards the connecting contact part.

Preferably, the at least one built-up layer is formed by electroless deposition of the coating material onto the base layer of the base contact part in order to use the previously described advantageous options and effects equally for the built-up layer.

Depending on the texture of the material of the terminal faces of the semiconductor substrate to be provided with the contact structure, the base contact part may have a base layer made of nickel or a base layer made of copper, wherein the former is utilized in the formation of a semiconductor substrate terminal face made of aluminum and the latter is utilized in the formation of a semiconductor substrate terminal face made of copper. In particular for enabling good adhesion of the connecting contact part applied to the base contact part, a built-up layer made of gold or palladium may be formed on the base layer made of nickel or else the base layer made of nickel may be provided with a first built-up layer made of palladium and a second built-up layer arranged thereon made of gold. Moreover, it may also be advantageous if a base layer made of nickel is provided with a built-up layer made of copper. In any case, it is advantageous if all layers of the base contact part, i.e. both the base layer and the one or more built-up layers are applied to the terminal face in a wireless deposition process.

The use of tin or an alloy containing tin as a connecting contact material proves to be particularly advantageous for the production of the connecting contact part, in order to realize a good mechanical adhesion to the base contact part and a lowest possible contact resistance on the one hand and, on the other hand, in order to realize a mechanically resistant and reliable connection between the base contact part and the terminal face of the contact substrate to be contacted due to the good wettability of tin also in the case of a thinly applied tin coating, i.e. a small layer thickness of the connecting contact part, by means of melting the connecting contact part.

The properties specified above and created by the differentiated configuration of the contact structure, which comprises a base contact part and a connecting contact part, produce a particularly advantageous effect if the height of the base contact part is several times the height of the connecting contact part, in particular in the instance where the height of the connecting contact part is ten to twenty percent of the height of the base contact part.

The inventive method has the features of claim 16.

In the inventive method, a base contact part is formed by electroless deposition of a base contact material onto the terminal face, and subsequently a connecting contact part is formed by means of sputtering or else by means of vapor-phase deposition of a connecting contact material onto the base contact part, wherein the connecting contact part has a lower melting point than the base contact material.

In a first advantageous variant of the method, prior to the formation of the connecting contact part, at least one resist layer which covers the base contact part is applied to a contact side of the semiconductor substrate, and subsequent to the formation of a coating opening which exposes a coating surface of the base contact part and which widens downwardly, in the resist layer, the connecting contact material is deposited onto the surface of the resist layer and the base contact part.

In a second advantageous variant of the method, prior to the formation of the connecting contact part, a resist structure comprising at least one lower resist layer and an upper resist layer arranged thereon is applied to a contact side of the semiconductor substrate, a staggered coating opening which widens downwardly is subsequently formed in the resist structure in such a manner that, firstly, a window opening exposing the lower resist layer is formed in the upper resist layer, the lower resist layer covering the base contact part is then removed through the window opening, and subsequent to the formation of the coating opening exposing the base contact part, the connecting contact material is deposited onto the surface of the upper resist layer and the base contact part.

Preferably, in both method variants, a coating surface, which is defined by projecting an opening cross-section onto the contact side of the semiconductor substrate, is smaller than a base surface of the coating opening.

It is especially advantageous to configure the coating surface, which is defined by projecting the opening cross-section onto the contact side of the semiconductor substrate, so as to be smaller than the surface of the base contact part in order to be able to apply a particularly small defined amount of the connecting contact material onto the base contact part.

Hereinafter, preferred embodiments of the invention will be described in more detail with reference to the drawings.

Figure 7:
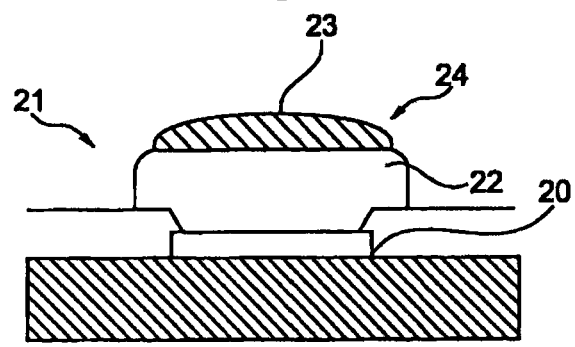
Figure 8:
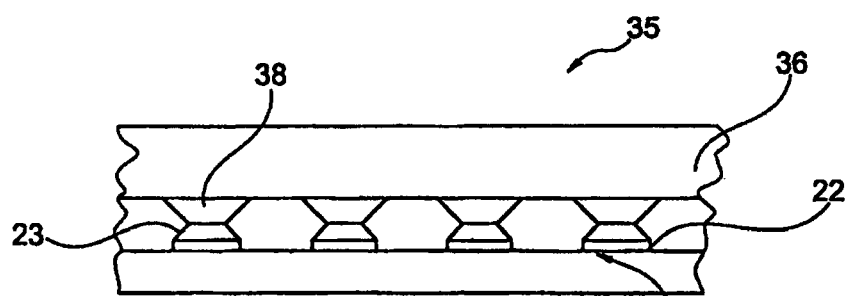

In the drawings:

FIG. 1: shows a base contact part formed on a contact side of a semiconductor substrate;

FIG. 2: shows a resist layer applied to the contact side of the semiconductor substrate according to a first variant of a method for producing a contact structure;

FIG. 3: shows a coating opening formed in the resist layer;

FIG. 4: shows the deposition of a connecting contact material onto the contact side of the semiconductor substrate;

FIG. 5: shows the removal of the resist coating subsequent to the deposition of the connecting contact material;

FIG. 6: shows a contact structure subsequent to the removal of the resist coating;

FIG. 7: shows a contact structure subsequent to the remelting of the connecting contact part arranged on the base contact part;

FIG. 8: shows a substrate arrangement comprising a contact arrangement formed from a plurality of contact structures;

FIG. 9: shows a resist structure on a contact side of a semiconductor substrate according to a second variant of a method for producing a contact structure;

FIG. 10: shows a window opening formed in an upper resist layer of the resist structure;

FIG. 11: shows a coating opening formed in the resist structure;

FIG. 12: shows the deposition of a connecting contact material onto the contact side of the semiconductor substrate;

FIG. 13: shows the removal of the resist structure from the contact side of the semiconductor substrate.

FIG. 1 shows the circumjacent region of a base contact part 22 of a contact structure 24 illustrated in FIGS. 6 and 7 and composed of the base contact part 22 and a connecting contact part 23, the base contact part 22 being formed on a terminal face 20 of a semiconductor substrate 21 by means of an electroless deposition method known per se.

The production of the base contact part 22 on the terminal face 20, as for instance illustrated in FIG. 1, is performed in such a manner that, due to the isotropic growth of the base contact part 22 produced in the deposition process, a region of a passivation layer 26 covering a contact side 25 of the semiconductor substrate 21, which region surrounds the terminal face 20, is covered as well.

The generation of the base contact part 22, in particular in the instance where the terminal face 20 is formed of copper, may be performed heterogeneously on the basis of the deposition of one single metal, for instance copper, or else in particular also in the case of an aluminum terminal face, by sequential configuration with a base layer made of nickel and one or more built-up layers 50, 52 in a transition zone towards the terminal face arranged thereon, wherein for instance a combination with (immersion) gold, copper or palladium as a built-up layer and, where appropriate, an arrangement of two built-up layers made of palladium or gold on a nickel base layer has proven to be advantageous.

The semiconductor substrate 21 for instance may be formed of materials such as Si, GaAs, SiGe or InP. Instead of a semiconductor substrate, a printed circuit board or the like which comprises a corresponding terminal face may equally be provided. The terminal face may also be formed by a carrier surface of an otherwise electrically non-conductive surface of a substrate and which has been prepared for electroless deposition, in order to produce electrically inactive contact structures, which merely fulfill a mechanical function, in particular a spacer function.

FIGS. 2 to 5 show a first variant for producing the contact structure 24 illustrated in FIGS. 6 and 7, wherein, firstly, a resist layer 27 made of a photoresist is applied to the contact side 25 of the semiconductor substrate 21 and subsequently, the resist layer 27 is lithographically structured, the result thereof being illustrated in FIG. 3, whereby a coating opening 29 which exposes the base contact part 22 is formed on the contact side 25.

When the coating opening 29 is formed by the application of a suitable developer onto the exposed resist layer 27, slanted recess walls 32 are created which form an undercut 31 in such a manner that a coating surface 31 defined by projecting an opening cross-section 30 of the coating opening 29 onto the contact side 25 of the semiconductor substrate 21 is smaller than a base surface 33 of the coating opening 29.

In the instance where, as shown in FIG. 3 using dash-dotted lines, the resist layer 27 covers a periphery of the surface of the base contact part 22 a coating surface 31 is realized which is clearly smaller than the surface of the base contact part 22.

As shown in FIG. 4, the connecting contact part 23 is formed on the resist layer 27 by means of sputtering or else by means of vapor-phase deposition of a connecting contact material 34, preferably containing tin, wherein the connecting contact part merely partially covers the base contact part 22 due to a coating shadow 44 created by the undercut 31. Moreover, due to the coating shadow, the recess walls 32 are free from a coating and thus are freely accessible for a subsequent rinsing process or the like to remove the resist layer 27, for instance with the aid of a solvent 37, as shown in FIG. 5, such that subsequent to the rinsing process, the contact structure 24 still remains on the contact side 25 of the semiconductor substrate 21, as shown in FIG. 6.

Subsequently, the connecting contact part 23 of the contact structure 24, as shown in FIG. 7, can be melted or else the connecting contact part 23 of the contact structure 24 illustrated in FIG. 6 is melted in a reflow process only in the production of the contact arrangement 35 illustrated in FIG. 8, which connects the semiconductor substrate 21 with a contact substrate 36, respectively a further semiconductor component, so that a joined connection between the base contact parts 22 of the semiconductor component 21 with contact metallizations 36 of the contact substrate 36 is created by the molten connecting contact parts 23.

The contact arrangement 35 illustrated in FIG. 8 can be formed at a wafer level, i.e. may serve for connecting two wafers, or else chips or substrates in chip size can be connected with one another or can each be contacted with a wafer.

Dimensional relations in which the height of the connecting contact part in the range of 10 to 20 percent of the height of the base contact part 22 have proven to be particularly advantageous in terms of the dimensions, respectively heights, of the base contact part 22 and the connecting contact part 23. In the case of a height of 3 to 20 µm of the base contact part 22, a height of approximately 0.3 to 2 µm is obtained for the connecting contact part 23.

FIGS. 9 to 13 show a second variant for producing the contact structure 24 illustrated in FIGS. 6 to 7, wherein in contrast to the first variant illustrated in FIGS. 2 to 5, starting from the semiconductor substrate 21 illustrated in FIG. 1, which has the base contact part 22 arranged on the contact side 25 thereof, a resist structure 38 is applied which has a first resist layer 39 directly applied to the contact side 25 and which has a second resist layer 40 applied to the resist layer 39.

The illustrated exemplary embodiment of the upper resist layer 40 shows a photoresist layer, similar to the variant illustrated in FIGS. 2 to 5, which can be structured with the aid of an exposure process and a development process. The lower resist layer 39 of the illustrated exemplary embodiment is a chemically activatable resist layer, for instance a so-called PMMA resist layer.

As shown in FIG. 10, for forming the coating opening 41 illustrated in FIG. 11, firstly, a window opening 42 is formed in the upper resist layer 40 and a suitable developer or solvent is then applied to the lower resist layer 39, in order to form the coating opening 41 which exposes the base contact part 22 in the lower resist layer 39 for instance by polymerization.

As is in particular shown in FIG. 11, a coating opening 41 is obtained which has a staggered recess wall 43 and which widens downwardly towards the base contact part 22.

As already described in view of the first variant, in particular with respect to FIG. 3, the coating opening 41 which widens downwardly towards the base contact part 22 has an opening cross-section 30 which is smaller compared with a base surface 33 of the coating opening 41 with the resultant coating shadow.

In the instance that, as illustrated in FIG. 11 using dash-dotted lines, the upper resist layer 40 covers a periphery of the surface of the base contact part 22, a coating surface 31 is obtained which is clearly smaller than the surface of the base contact part 22.

As shown in FIG. 12, the connecting contact part 23 is formed on the upper resist layer 40 by means of sputtering or vapor-phase deposition of the connecting contact material 34, wherein the connecting contact part only partially covers the base contact part 22 due to a coating shadow 45 created by the staggered recess wall 43, so that the previously described advantages are realized.

Following a rinsing process, which enables the removal of the resist arrangement 38, respectively the dissolution of the lower resist layer 39, for instance with the aid of a solvent 46, as illustrated in FIG. 13, the contact structure illustrated in FIG. 6 still remains on the contact side 25 of the semiconductor substrate 21.

The invention claimed is:

1. A contact structure for a semiconductor substrate, in particular for a terminal face of a semiconductor substrate, said contact structure comprising;

a base contact part arranged on a terminal face of the semiconductor substrate, said base contact part being formed from a base contact material applied to the terminal face in an electroless deposition process; and at least one connecting contact part arranged on the base contact part, said connecting contact part being formed from a connecting contact material applied to the base contact part by one of a sputtering process and a vapor-phase deposition process, and the base contact part has a layer structure featuring two built-up layers, said layer structure including a base layer and at least one built-up layer in a transition zone towards the connecting contact part, wherein the base contact part has an exposed upper surface contacting the connecting contact part, the connecting contact part partially covering the exposed upper surface of the base contact part due to a coating shadow, and the connecting contact part being formed from a connecting contact material which has a lower melting point than a base contact material of the base contact part.

2. The contact structure according to claim 1 in which the connecting contact part is formed from the connecting contact material applied to the base contact part by means of a sputtering process.

3. The contact structure according to claim 1 in which the connecting contact part is formed from the connecting contact material applied to the base contact part by means of a vapor-phase deposition process.

4. The contact structure according to claim 1 in which the connecting contact part is formed from the connecting contact material applied to the base contact part by one of means of a sputtering process and means of a vapor-phase deposition process, and the base contact part is formed homogeneously.

5. The contact structure according to claim 4, in which the base contact material of the base contact part is essentially formed of copper.

6. The contact structure according to claim 1, in which the base contact material of the base contact part is essentially formed of nickel.

7. The contact structure according to claim 6, in which the built-up layer is essentially formed of gold or palladium.

8. The contact structure according to claim 1, in which the first built-up layer is formed of palladium and the second built-up layer arranged on the first built-up layer is essentially formed of gold.

9. The contact structure according to claim 1 in which the at least one built-up layer is formed by electroless deposition of a coating material onto the base layer of the base contact part.

10. The contact structure according to claim 1, in which the connecting contact material of the connecting contact part is essentially formed of tin or of an alloy containing tin.

11. A contact structure for a semiconductor substrate, in particular for a terminal face of a semiconductor substrate, said contact structure comprising;
- a base contact part arranged on a terminal face of the semiconductor substrate; and
- at least one connecting contact part arranged on the base contact part, wherein the base contact part has an exposed upper surface contacting the connecting contact part, the connecting contact part partially covering the exposed upper surface of the base contact part due to a coating shadow, and the connecting contact part being formed from a connecting contact material which has a lower melting point than a base contact material of the base contact part, the height of the base contact part being several times the height of the connecting contact part.

12. The contact structure according to claim 11, in which the height of the connecting contact part is 10% to 20% of the height of the base contact part.

13. A method for producing a contact structure on a terminal face of a semiconductor substrate, said method comprising:
- forming a base contact part by electroless deposition of a base contact material onto the terminal face;
- applying at least one resist layer which covers the base contact part to a contact side of the semiconductor substrate;
- forming a coating opening in the at least one resist layer, said coating opening exposing a coating surface of the base contact part and which widens downwardly; and
- subsequently, forming a connecting contact part by one of means of sputtering and means of vapor-phase deposition of a connecting contact material onto the base contact part, wherein the connecting contact material is deposited onto the surface of the resist layer and the base contact part, and has a lower melting point than the base contact material.

14. The method according to claim 13, in which prior to the formation of the connecting contact part, a resist structure comprising at least one lower resist layer and an upper resist layer arranged thereon is applied to a contact side of the semiconductor substrate, a staggered coating opening which widens downwardly is subsequently formed in the resist structure in such a manner that, firstly, a window opening exposing the lower resist layer is formed in the upper resist layer, the lower resist layer covering the base contact part is then removed through the window opening, and subsequent to the formation of the coating opening exposing the base contact part, the connecting contact material is deposited onto the surface of the upper resist layer and the base contact part.

15. The method according to claim 13, in which a coating surface, which is defined by projecting an opening cross-section onto the contact side of the semiconductor substrate, is smaller than a base surface of the coating opening.

16. The method according to claim 15, in which the coating surface, which is defined by projecting the opening cross-section onto the contact side of the semiconductor substrate, is smaller than the surface of the base contact part.

17. The contact structure according to claim 1, in which an opening formed through a resist layer covering said base contact part exposes said exposed upper surface, and an under cut formed in walls of said opening forms said coating shadow.

\* \* \* \* \*

UNITED STATES PATENT AND TRADEMARK OFFICE
CERTIFICATE OF CORRECTION

PATENT NO. : 8,497,578 B2
APPLICATION NO. : 12/991581
DATED : July 30, 2013
INVENTOR(S) : Zakel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 52 days.

Signed and Sealed this

Fifteenth Day of September, 2015

Michelle K. Lee
*Director of the United States Patent and Trademark Office*